US008637928B2

(12) United States Patent
Obatake et al.

(10) Patent No.: US 8,637,928 B2
(45) Date of Patent: Jan. 28, 2014

(54) SEMICONDUCTOR DEVICE

(75) Inventors: Manji Obatake, Kanagawa-ken (JP);
Tomoko Matsudai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 474 days.

(21) Appl. No.: 13/053,063

(22) Filed: Mar. 21, 2011

(65) Prior Publication Data

US 2011/0233668 A1 Sep. 29, 2011

(30) Foreign Application Priority Data

Mar. 25, 2010 (JP) ................................. 2010-071060

(51) Int. Cl.
*H01L 29/66* (2006.01)

(52) U.S. Cl.
USPC ............ 257/335; 257/E29.012; 257/E29.027; 257/E29.066; 438/197

(58) Field of Classification Search
USPC ........... 257/335, E29.012, E29.027, E29.066; 438/197
See application file for complete search history.

(56) References Cited

U.S. PATENT DOCUMENTS

| | | | | |
|---|---|---|---|---|
| 4,809,045 | A * | 2/1989 | Yilmaz | 257/341 |
| 5,541,123 | A * | 7/1996 | Williams et al. | 438/202 |
| 6,518,624 | B2 * | 2/2003 | Kim et al. | 257/330 |
| 6,777,747 | B2 * | 8/2004 | Yedinak et al. | 257/339 |
| 7,157,785 | B2 * | 1/2007 | Takei et al. | 257/565 |
| 8,067,801 | B2 * | 11/2011 | Matsudai et al. | 257/336 |
| 8,507,985 | B2 * | 8/2013 | Hirasozu et al. | 257/339 |

FOREIGN PATENT DOCUMENTS

| | | |
|---|---|---|
| CN | 1564318 A | 1/2005 |
| CN | 101266930 A | 9/2008 |
| JP | 2003-249646 | 9/2003 |

(Continued)

OTHER PUBLICATIONS

S. Yanagi et al., "0.15 μm BiC-DMOS technology with novel Stepped-STI N-channel LDMOS", ISPSD Jun. 14-17, 2009, pp. 80-83.

(Continued)

*Primary Examiner* — William D Coleman
*Assistant Examiner* — Nicholas Tobergte
(74) *Attorney, Agent, or Firm* — Patterson & Sheridan LLP (57) ABSTRACT

According to one embodiment, a semiconductor device includes a base region of a second conductivity type, a drift region of a first conductivity type, an insulating layer, a drain region of the first conductivity type, a gate oxide film, a gate electrode, a first main electrode, and a second main electrode. The base region includes a source region of the first conductivity type. The drift region is adjacent to the base region. The insulating layer is provided from a surface to inside of the drift region. The drain region is provided in the surface of the drift region and opposed to the source region across the base region and the insulating layer. The gate oxide film is provided on a surface of the base region. The gate electrode is provided on the gate oxide film. The first main electrode is connected to the source region. The second main electrode is connected to the drain region. As viewed in a direction perpendicular to the surface of the base region, the source region and at least a part of the drain region extend generally parallel in a line shape, and a length of a portion of the drift region sandwiched between the insulating layer and the base region is shorter in the generally parallel extending direction than in a direction generally perpendicular to the generally parallel extending direction.

20 Claims, 8 Drawing Sheets

(56) References Cited

FOREIGN PATENT DOCUMENTS

| JP | 2006-173357 | 6/2006 |
|----|-------------|--------|
| JP | 2007-073942 | 3/2007 |
| JP | 2007-088369 | 4/2007 |
| JP | 2009-170671 | 7/2009 |
| JP | 2010-258226 | 11/2010 |

OTHER PUBLICATIONS

S. Merchant et al., "Realization of High Breakdown Voltage (> 700 V) in Thin SOI Devices", 1991 IEEE, pp. 31-35.

T. Matsudai et al., "Thin SOI IGBT leakage current and a new device structure for high temperature operation", Proc. of the 6$^{th}$ Internet Symposium on Power Semiconductor Devices & IC's. Davos, Switzerland May 31-Jun. 2, 1994. Session 9: IGBT 3 Paper 9.1 pp. 399-403.

U.S. Appl. No. 12/878,948.

Chinese Office Action dated Feb. 5, 2013, filed in corresponding Chinese Application No. 2011-10072003.2, 6 pages (with English translation).

Japanese Office Action dated Jul. 24, 2012, filed in Japanese counterpart Application No. 2010-071060, 3 pages (with English translation).

* cited by examiner

SEMICONDUCTOR DEVICE

CROSS-REFERENCE TO RELATED APPLICATIONS

This application is based upon and claims the benefit of priority from the prior Japanese Patent Application No. 2010-071060, filed on Mar. 25, 2010; the entire contents of which are incorporated herein by reference.

FIELD

Embodiments described herein relate generally to a semiconductor device.

BACKGROUND

As one type of power MOS (metal oxide semiconductor) field effect transistors, the lateral DMOS (double diffused metal oxide semiconductor) field effect transistor is known. In DMOS field effect transistors, typically, the measure to extend the length of the drift region (drift length) is taken to increase the device breakdown voltage. In terms of device layout, the measure to increase the breakdown voltage is often taken in the device termination region rather than in the internal region of the device (device active region). This is because, despite elaborate design of the internal region (device active region) relevant to device characteristics, the device characteristics are difficult to control if there is the possibility of decreasing the device breakdown voltage in the device termination region not affecting the device characteristics. However, if the measure to extend the drift length is taken as described above to increase the breakdown voltage of the device termination region, the lateral DMOS field effect transistor has the problem of increased device area.

DETAILED DESCRIPTION

In general, according to one embodiment, a semiconductor device includes a base region of a second conductivity type, a drift region of a first conductivity type, an insulating layer, a drain region of the first conductivity type, a gate oxide film, a gate electrode, a first main electrode, and a second main electrode. The base region includes a source region of the first conductivity type. The drift region is adjacent to the base region. The insulating layer is provided from a surface to inside of the drift region. The drain region is provided in the surface of the drift region and opposed to the source region across the base region and the insulating layer. The gate oxide film is provided on a surface of the base region. The gate electrode is provided on the gate oxide film. The first main electrode is connected to the source region. The second main electrode is connected to the drain region. As viewed in a direction perpendicular to the surface of the base region, the source region and at least a part of the drain region extend generally parallel in a line shape, and a length of a portion of the drift region sandwiched between the insulating layer and the base region is shorter in the generally parallel extending direction than in a direction generally perpendicular to the generally parallel extending direction.

Embodiments of the invention will now be described with reference to the drawings.

First Embodiment

Figure 1:
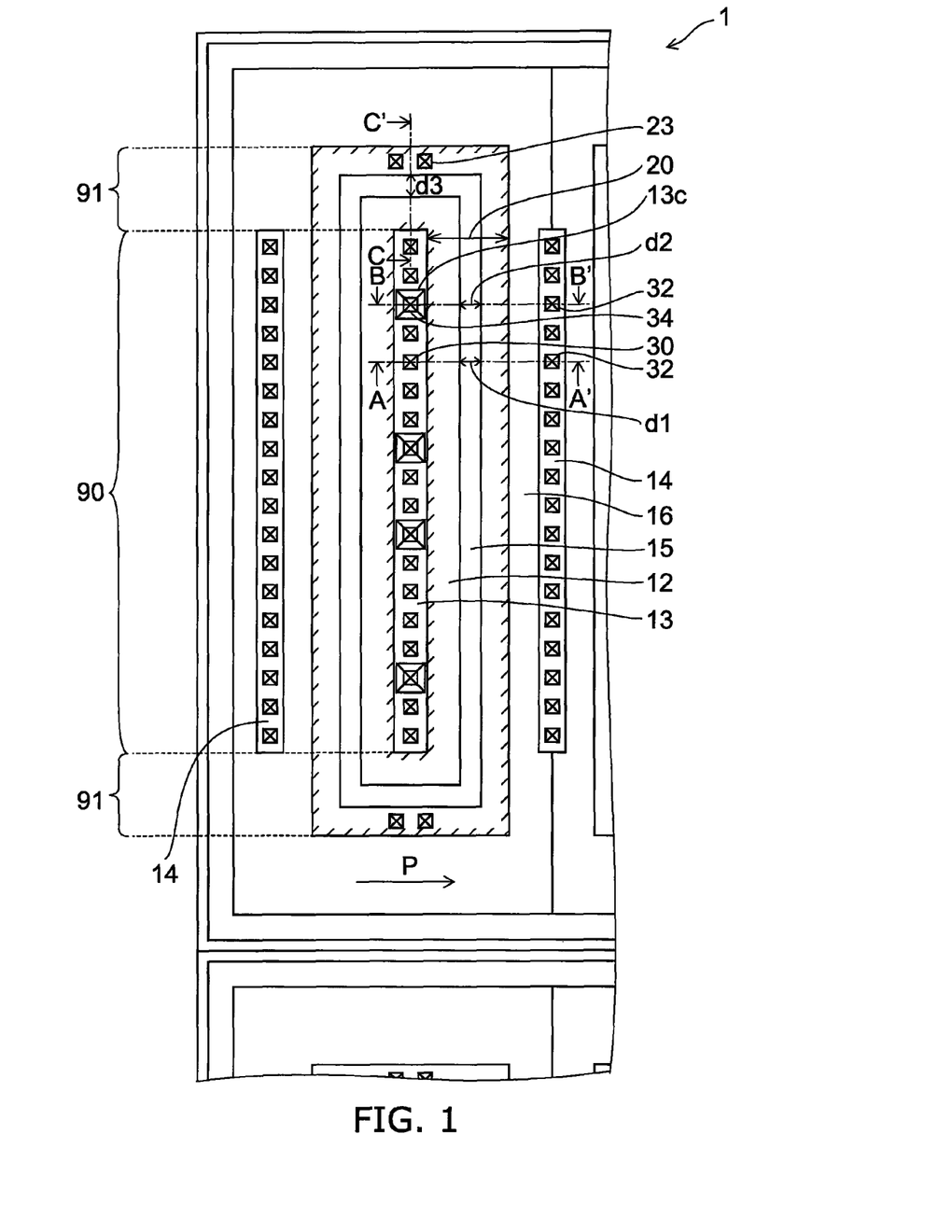
FIG. 1 is a plan view of the main part of a semiconductor device according to an embodiment.

FIG. 1 is a plan view of the main part of a semiconductor device according to this embodiment.

Figure 2A:
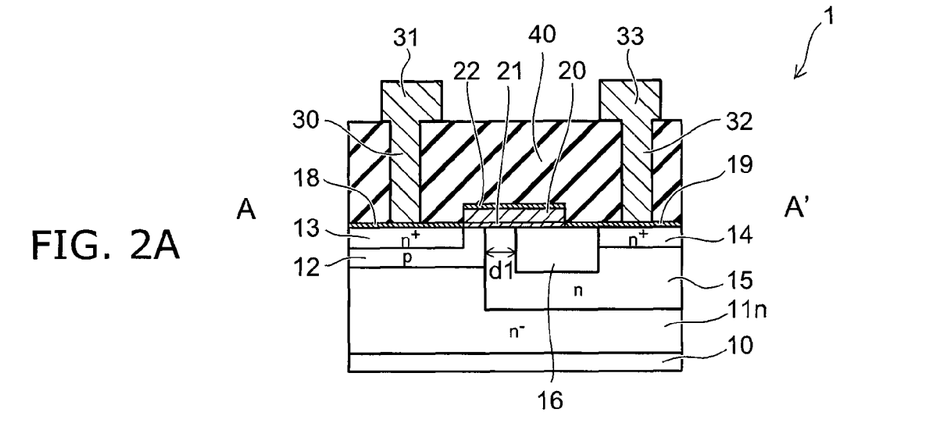
FIGS. 2A to 2C are cross-sectional views of the main part of the semiconductor device according to the embodiment.
Figure 2B:
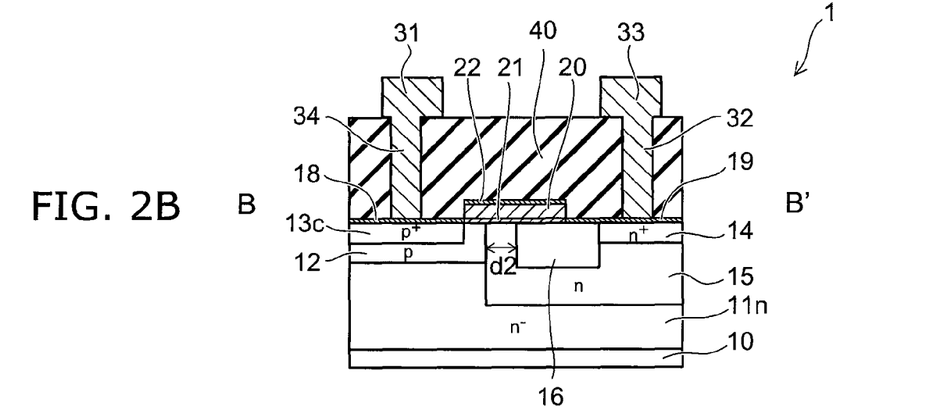
Figure 2C:
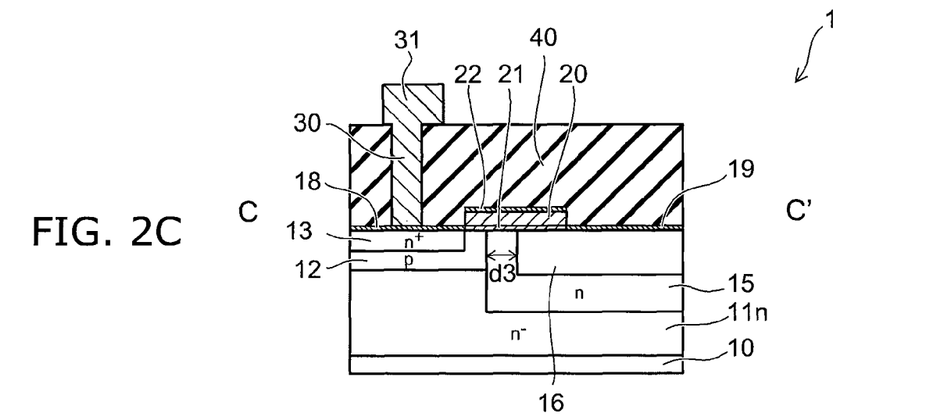

FIGS. 2A to 2C are cross-sectional views of the main part of the semiconductor device according to this embodiment. Here, FIG. 2A shows the A-A' cross section of FIG. 1. FIG. 2B shows the B-B' cross section of FIG. 1. FIG. 2C shows the C-C' cross section of FIG. 1. For convenience of describing the internal structure of the semiconductor device 1, FIG. 1 does not show the interlayer insulating film 40, the source electrode 31, and the drain electrode 33 shown in FIGS. 2A to 2C.

The semiconductor device 1 shown in FIG. 1 and FIGS. 2A to 2C is a lateral DMOS. The semiconductor device 1 includes a semiconductor layer 11n of the first conductivity type, a base region 12 of the second conductivity type provided in the surface of the semiconductor layer 11n, a source region 13 of the first conductivity type provided in the surface of the base region 12, a drift region 15 of the first conductivity type provided from the surface to the inside of the semiconductor layer 10 and being adjacent to the base region 12, and a drain region 14 of the first conductivity type provided in the surface of the drift region 15. In this embodiment, for instance, the first conductivity type is n-type, and the second conductivity type is p-type. The semiconductor device 1 further includes an STI (shallow trench isolation) region 16 made of an insulating layer provided from the surface to the inside of the drift region 15 outside the drain region 14, a gate electrode 20 as a control electrode for controlling the electrical continuity path of the base region 12, a source electrode 31 as a first main electrode connected to the source region, and a drain electrode 33 as a second main electrode connected to the drain region 14. Such a semiconductor device 1 is used as e.g. an element in a power device (such as a synchronous rectifier circuit device).

First, the semiconductor device 1 is outlined with reference to the plan view (FIG. 1).

As shown in FIG. 1, in the plane (major surface) of the semiconductor device 1, the source region 13 extends in a line shape. In the source region 13, for instance, back gate regions 13c different in conductivity type from the source region 13 are periodically arranged. To the source region 13, the source electrode 31 is connected through a source contact region 30. To the back gate region 13c, the source electrode 31 is connected through a back gate contact region 34. In this embodiment, the back gate region 13c is included in the source region 13, and the source region 13 and the back gate region 13c are collectively referred to as the source region. As viewed in a direction perpendicular to the surface of the base region 12, the base region 12 is surrounded by the drift region 15 and the STI region 16.

Furthermore, in the plane of the semiconductor device 1, at least a part of the drain region 14 extends in a line shape generally parallel to the source region 13. To the drain region 14, the drain electrode 33 is connected through a drain contact region 32. The source regions 13 and the drain regions 14 in a line shape are alternately and repetitively arranged in a direction generally perpendicular to the direction of extending generally parallel and opposite to each other. This alternately arranging direction is indicated by arrow P. Furthermore, the source region 13 is surrounded by the gate electrode 20.

In the semiconductor device 1, the region sandwiched between the source region 13 and the drain region 14 is referred to as the device active region 90 of the semiconductor device 1. The region outside the device active region 90 is referred to as the device termination region 91 of the semiconductor device 1. That is, in the device active region 90, the source region 13 and the drain region 14 are opposed generally parallel to each other. The gate electrode 20 is located between the source region 13 and the drain region 14. By controlling the potential of the gate electrode 20 through a gate contact region 23, the electrical continuity between the source and the drain can be turned on/off.

The structure of the semiconductor device 1 is described in detail with reference to the cross-sectional views (FIGS. 2A to 2C) of the semiconductor device 1. The region of the semiconductor device 1 shown in FIGS. 2A to 2C is the device active region 90 in FIGS. 2A and 2B and the device termination region 91 in FIG. 2C.

As shown in FIGS. 2A to 2C, in the semiconductor device 1, for instance, an epitaxially grown N$^-$-type semiconductor layer 11n is provided on an N$^+$-type semiconductor layer (single crystal silicon substrate) 10. The semiconductor layer 11n may be replaced by an N$^-$-type well region. The semiconductor layer of the first conductivity type is provided below the base region 12 and the drift region 15. This embodiment will be described with the N$^-$-type semiconductor layer 11n taken as an example.

A p-type base region 12 is provided in the surface of the semiconductor layer 11n. The base region 12 may be referred to as a p-type body region or p-type well region. In the surface of the base region 12, an N$^+$-type source region 13 and a P$^+$-type back gate region 13c adjacent to the source region 13 are provided (see FIGS. 2A and 2B). The back gate region 13c has different impurity concentration from impurity concentration of the base region 12. In addition, in the surface of the semiconductor layer 11n, an N$^+$-type drain region 14 is provided and spaced from the base region 12. Thus, the source region 13 and the drain region 14 extend in a line shape as viewed in the direction perpendicular to the surface of the semiconductor layer 10 (see FIG. 1). A silicide layer 18 is provided on the source region 13 and the back gate region 13c. A silicide layer 19 is provided on the drain region 14.

An STI region 16 made of an insulating layer is provided from the surface to the inside of the drift region 15. The bottom surface of the STI region 16 is located below the bottom surface of the drain region 14. Part of the side surface of the STI region 16 on the drain region 14 side is in contact with the drain region 14. That is, the side surface and bottom surface of the STI region 16 are surrounded by the drift region 15 and the drain region 14. The drain region 14 is providing opposing the source region 13 across the base region 12 and the STI region 16. As viewed from above the semiconductor device 1, the source region 13 is surrounded by the STI region 16 (see FIG. 1).

A gate electrode 20 is provided in a region immediately above the base region 12 between the source region 13 (or the back gate region 13c) and the STI region 16, above the drift region 15 between the base region 12 and the STI region 16, and above part of the STI region 16. The gate electrode 20 is connected to the gate contact region 23 illustrated in FIG. 1. A gate oxide film 21 is provided between the gate electrode 20 on one hand and the base region 12, the drift region 15, and the STI region 16 on the other. The gate electrode 20 is provided on the gate oxide film 21, and a silicide layer 22 is provided on the gate electrode 20.

In this embodiment, the length of the gate electrode 20 in the direction from the source region 13 toward the STI region 16 is referred to as gate length. The gate dimension generally orthogonal to the gate length is referred to as gate width. The gate length of the semiconductor device 1 is e.g. 10 µm or less.

In this embodiment, the distance between the base region 12 and the STI region 16 is denoted by d1 (FIG. 2A), d2 (FIG. 2B), and d3 (FIG. 2C). The distances d1, d2, and d3 are the lengths of the portions of the drift region 15 sandwiched between the base region 12 and the STI region 16. In the configuration of the semiconductor device 1, the distances d1 and d2 are generally equal, and the distance d3 is shorter than the distances d1 and d2.

Thus, the source region 13 and the drain region 14 extend at least generally parallel in a line shape as viewed in the direction perpendicular to the surface of the semiconductor layer 10. With regard to the length d of the portion of the drift region sandwiched between the STI region 16 made of an insulating layer and the base region 12, the length d3 in the generally parallel extending direction is shorter than the lengths d1 and d2 in the direction generally perpendicular to the generally parallel extending direction. In other words, with regard to the length d of the portion of the drift region 15 sandwiched between the STI region 16 made of an insulating layer and the base region 12, the length d3 in the direction generally perpendicular to the direction (arrow P) in which the source regions 13 and the drain regions 14 are alternately repeated is shorter than the lengths d1 and d2 in the direction generally parallel to the alternately repeating direction. That is, the distance d3 of the device termination region 91 is configured to be shorter than the distances d1 and d2 of the device active region 90.

Even in such configuration, the semiconductor device 1 has a high source-drain breakdown voltage (BV$_{dSS}$).

Here, the silicide layer 18 is interposed between the source region 13 and the source contact region 30. The silicide layer 18 is interposed between the back gate region 13c and the back gate contact region 34. The silicide layer 19 is interposed between the drain region 14 and the drain contact region 32. An interlayer insulating film 40 is provided above the source region 13 (or the back gate region 13c), the drain region 14, the gate electrode 20, and the STI region 16 exposed from the gate electrode 20.

To adjust the threshold voltage (Vth) of the DMOS, an implantation region (not shown) different in impurity concentration from the base region 12 is provided in the surface of the base region 12 between the source region 13 and the back gate region 13c on one hand and the drift region 15 on the other. As an alternative design, the threshold voltage may be adjusted by the base region 12.

In the semiconductor device 1, the source contact regions 30 are parallel connected to a common source electrode 31, and the drain contact regions 32 are parallel connected to a common drain electrode 33 (not shown). That is, a plurality of unit MOSFETs, each including the base region 12, the source region 13, the drain region 14, the drift region 15, and the gate electrode 20, are connected by a wiring (not shown). Thus, a large current can be passed in the semiconductor device 1.

Next, operational effects of the semiconductor device 1 are described.

The potential difference between the source region 13 and the gate electrode 20 of the semiconductor device 1 is set to a voltage (e.g., 0 V) lower than the threshold to apply a positive voltage (reverse bias voltage) to the drain region 14 relative to the source region 13. Then, from the junction (pn junction interface) of the drift region 15 and the base region 12 below the gate electrode 20, a depletion layer extends toward the drift region 15 and the base region 12.

In the semiconductor device 1 according to this embodiment, the impurity concentration (dose amount) of the drift region 15 is adjusted so that the portion of the drift region 15 sandwiched between the STI region 16 and the base region 12 is completely depleted upon application of the aforementioned reverse bias voltage. For instance, the drift region 15 over the distance d1 shown in FIG. 2A and the drift region 15 over the distance d2 shown in FIG. 2B are completely depleted upon application of the aforementioned reverse bias voltage. The drift region 15 over the distance d3 shown in FIG. 2C also constitutes the same member as the drift region 15 shown in FIGS. 2A and 2B, and hence is completely depleted upon application of the aforementioned reverse bias voltage. The depletion layer thus depleted can be approximated by a dielectric layer.

Hence, the applied reverse bias voltage is shared by the depletion layer produced in the drift region 15 and the STI region (insulating layer) 16 adjacent to the drift region 15. Here, with the decrease of the length d of the drift region 15, the proportion of the reverse bias voltage shared by the STI region 16 made of an insulating layer becomes higher. In the semiconductor device 1, the breakdown voltage is higher in the STI region 16 made of an insulating layer than in the semiconductor layer. Hence, in the case where the depletion layer is in communication with the STI region 16, the share of the voltage applied to the STI region 16 increases with the decrease of the length d of the drift region 15. Thus, in the semiconductor device 1 according to this embodiment, the breakdown voltage is increased not by extending the length d3 of the drift region 15 in the device termination region 91 sandwiched between the STI region 16 and the base region 12. Conversely, the length d3 of the portion of the drift region 15 sandwiched between the STI region 16 and the base region 12 in the device termination region 91 is made shorter than the lengths d1 and d2 of the portion of the drift region sandwiched between the STI region 16 and the base region 12 in the device active region 90 to increase the source-drain breakdown voltage ($BV_{dSS}$).

Figure 3A:
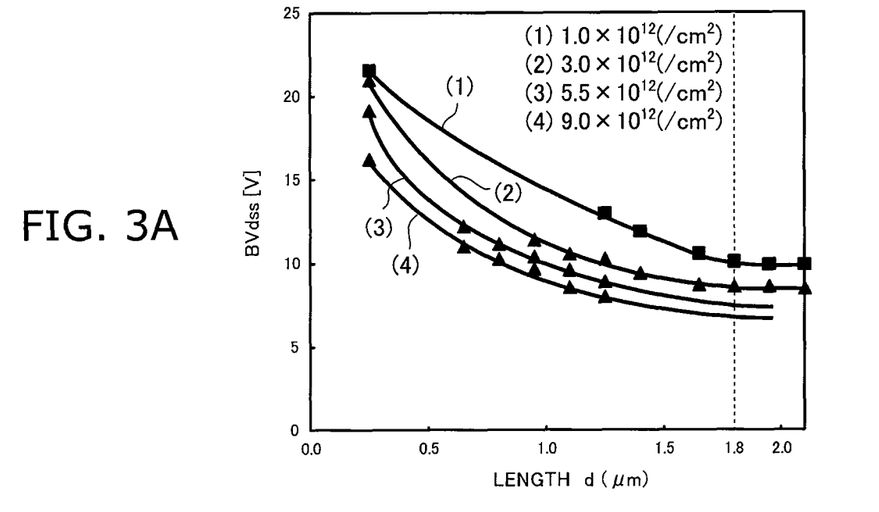
FIGS. 3A and 3B illustrate the relationship between the source-drain breakdown voltage and the length of a portion of a drift region sandwiched between a base region and an STI region.
Figure 3B:
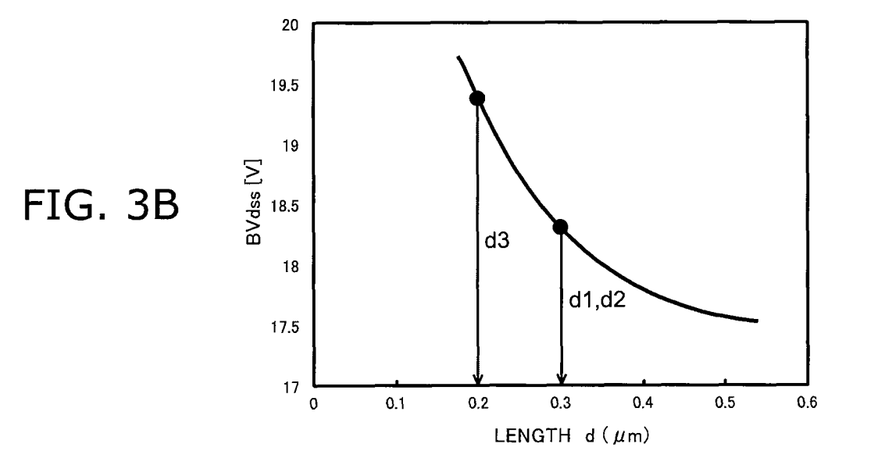

FIGS. 3A and 3B illustrate the relationship between the source-drain breakdown voltage ($BV_{dSS}$) and the length of the portion of the drift region sandwiched between the base region and the STI region. This result was obtained by the inventors through simulation experiments.

In FIGS. 3A and 3B, the horizontal axis represents the length d (d1 to d3) of the portion of the drift region 15 sandwiched between the base region 12 and the STI region 16. The vertical axis represents the source-drain breakdown voltage ($BV_{dSS}$).

FIG. 3A is a graph obtained by simulating the relationship between the length d and $BV_{dSS}$ for cases where the dose amount of impurity of the drift region 15 is set to (1) $1.0 \times 10^{12}/cm^2$, (2) $3.0 \times 10^{12}/cm^2$, (3) $5.5 \times 10^{12}/cm^2$, and (4) $9.0 \times 10^{12}/cm^2$. As seen from this graph, irrespective of the dose amount of impurity of the drift region 15, $BV_{dSS}$ increases with the decrease of the length d at least in the region where the length is 1.8 μm or less. The reason for this is considered as follows. The applied reverse bias voltage is shared by the depletion layer (dielectric layer) and the STI region 16. Hence, with the decrease of the length d, the proportion of the reverse bias voltage shared by the STI region 16 (insulating layer) having higher breakdown voltage is increased.

Typically, as a technique for increasing $BV_{dSS}$, it may be contemplated to extend the length d of the portion of the drift region 15 sandwiched between the base region 12 and the STI region 16. This method is based on the fact that by extending the length d, the voltage gradient in the portion of the drift region 15 sandwiched between the base region 12 and the STI region 16 is made gradual, which has the effect of increasing $BV_{dSS}$. However, this technique has an adverse effect of increasing the device area because the length d is made longer.

In contrast, in the semiconductor device 1, $BV_{dSS}$ is increased not by extending the length d. Conversely, the source-drain breakdown voltage ($BV_{dSS}$) is increased by reducing the length of the portion of the drift region 15 sandwiched between the STI region 16 and the base region 12.

In the semiconductor device 1 according to this embodiment, the distances d1 and d2 of the device active region 90 affecting the device characteristics are set to a prescribed value as required by the device characteristics. In this case, as shown in FIG. 3B, the semiconductor device 1 is designed so that the distance d3 of the device termination region 91 not affecting the device characteristics is made shorter than the distances d1 and d2. In other words, the length of the portion of the drift region 15 sandwiched between the STI region 16 and the base region 12 is configured so as to be shorter in the direction generally perpendicular to the alternately repeating direction of the source regions 13 and the drain regions 14 than in the direction generally parallel to the alternately repeating direction.

Consequently, $BV_{dSS}$ of the device termination region 91 can be made higher than $BV_{dSS}$ of the device active region 90 without increasing the area of the device termination region 91. In such a structure, the device termination region 91 irrelevant to the device operation is less prone to breakdown before occurrence of breakdown in the device active region 90.

In the semiconductor device 1 according to this embodiment, the distance d (d1, d2, and d3) is set to 1.8 μm or less to increase the device breakdown voltage while suppressing the increase of device area. If a voltage is applied between the source and drain of the semiconductor device 1 to set the potential difference between the source region 13 and the gate electrode 20 equal to or more than the threshold, then a channel layer is formed in the surface of the base region 12 shown in FIGS. 2A and 2B. Thus, a current can be passed between the source and the drain.

Here, if the distance d (d1 to d3) of the portion of the drift region 15 sandwiched between the base region 12 and the STI region 16 is made too short, the current path in this portion of the drift region is narrowed. This may cause a phenomenon of increasing the on-resistance (RonA). However, the aforementioned length d is shortened only in the device termination region 91 not affecting the device characteristics. Hence, this does not increase the on-resistance (RonA) of the overall device.

Next, other embodiments will be described. In the following description, like components are labeled with like reference numerals, and the description of the previously described components and the function and effect thereof is omitted as necessary.

Second Embodiment

Figure 4:
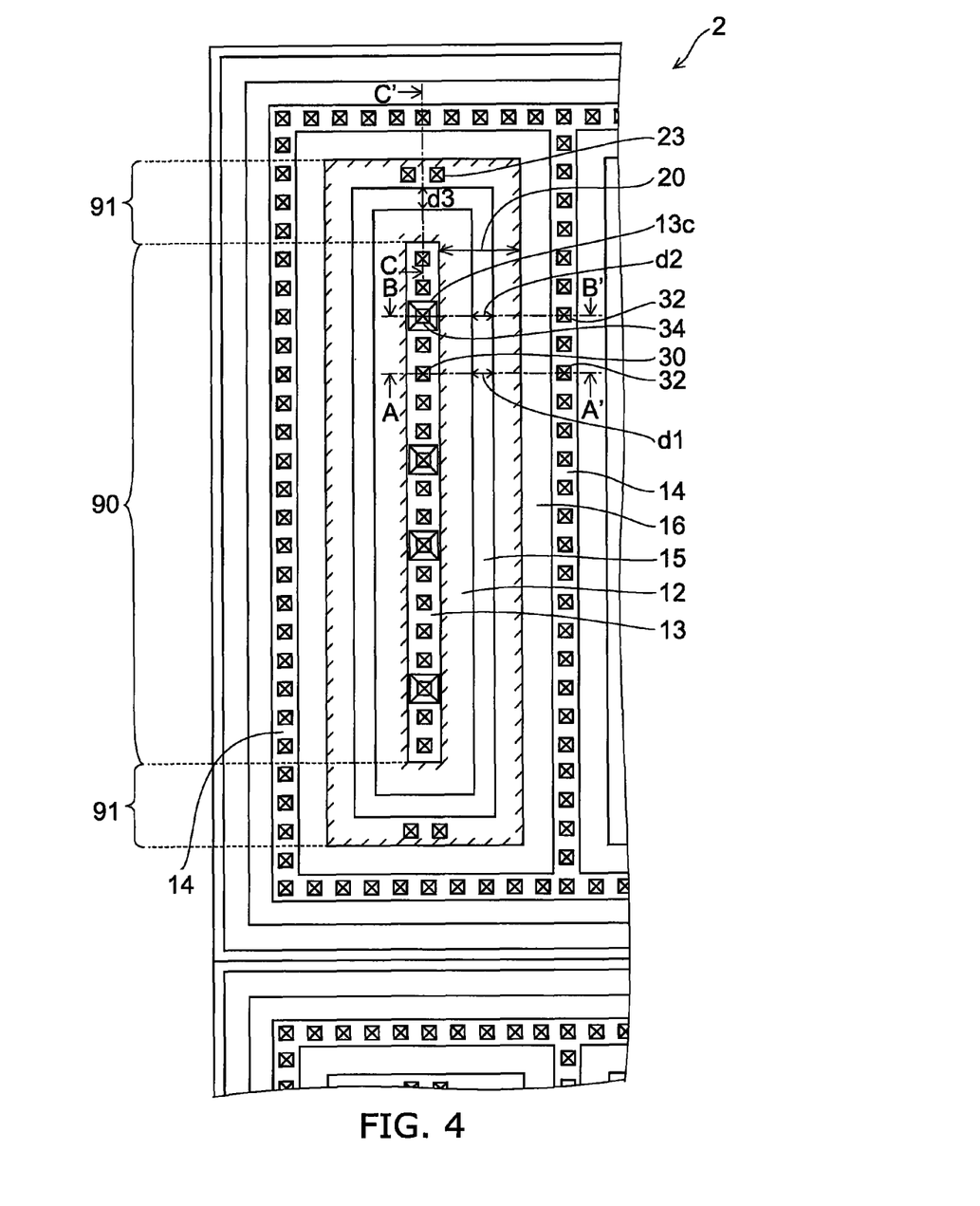
FIG. 4 is a plan view of the main part of a semiconductor device according to an embodiment.

FIG. 4 is a plan view of the main part of a semiconductor device according to this embodiment.

Figure 5A:
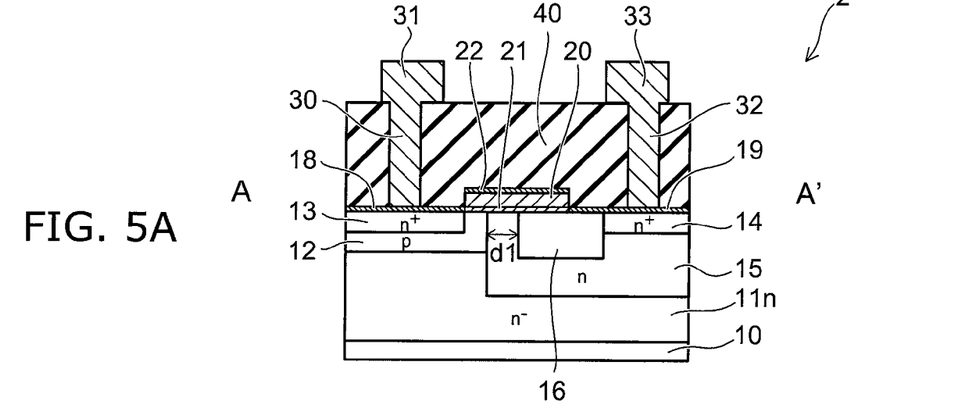
FIGS. 5A to 5C are cross-sectional views of the main part of the semiconductor device according to the embodiment.
Figure 5B:
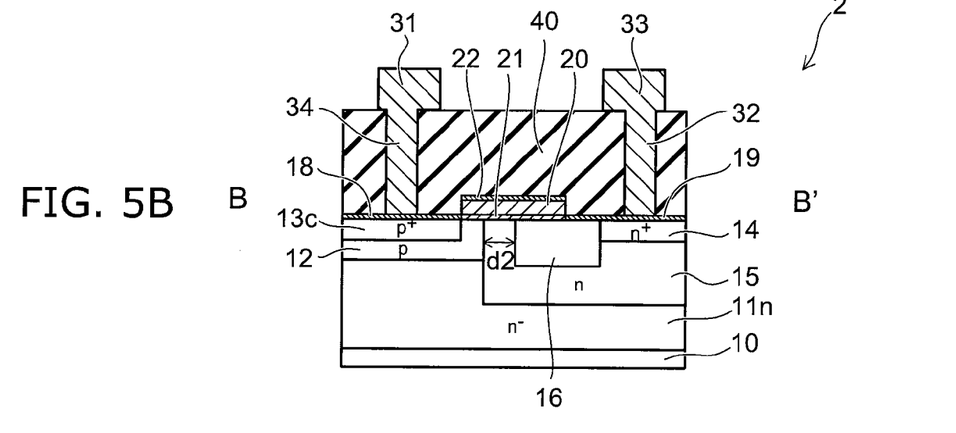
Figure 5C:
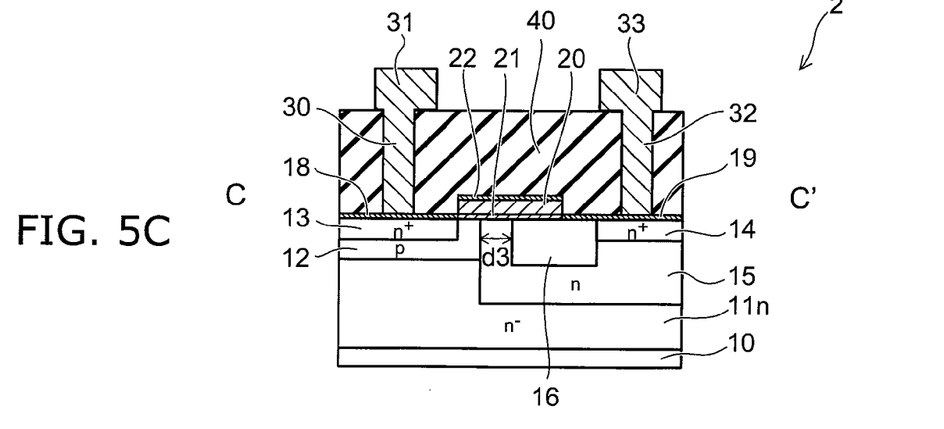

FIGS. 5A to 5C are cross-sectional views of the main part of the semiconductor device according to this embodiment. Here, FIG. 5A shows the A-A' cross section of FIG. 4. FIG. 5B shows the B-B' cross section of FIG. 4. FIG. 5C shows the C-C' cross section of FIG. 4. For convenience of describing the internal structure of the semiconductor device 2, FIG. 4 does not show the interlayer insulating film 40, the source electrode 31, and the drain electrode 33 shown in FIGS. 5A to 5C.

The semiconductor device 2 has the same basic configuration as the semiconductor device 1. However, in the semiconductor device 2, the drain region 14 surrounds the source region 13 and the gate electrode 20 as viewed in the direction perpendicular to the surface of the semiconductor layer 10. In the following, the semiconductor device 2 is described.

First, the semiconductor device 2 is described with reference to FIG. 4.

In the plane of the semiconductor device 2, the source region 13 extends in a line shape. In the source region 13, for instance, back gate regions 13c different in conductivity type from the source region 13 are periodically arranged. Furthermore, in the plane of the semiconductor device 2, the drain region 14 extends in a line shape so as to be generally parallel and opposed to the source region 13 in the device active region 90. The base region 12 is surrounded by the drain region 14 as viewed in the direction perpendicular to the surface of the base region 12. Furthermore, the drain region 14 is arranged so as to surround the source region 13, the gate electrode 20, etc. as viewed in the direction perpendicular to the surface of the semiconductor layer 10. The source regions 13 and the drain regions 14 are alternately arranged in a direction generally perpendicular to the direction of extending generally parallel and opposite to each other. The gate length of the semiconductor device 2 is e.g. 10 μm or less.

The structure of the semiconductor device 2 is described in detail with reference to FIGS. 5A to 5C.

The configuration of FIGS. 5A and 5B is the same as the configuration of FIGS. 2A and 2B, and hence the description thereof is omitted. In FIG. 5C, for instance, a semiconductor layer 11n is provided on the semiconductor layer 10. A base region 12 is provided in the surface of the semiconductor layer 11n. A source region 13 is provided in the surface of the base region 12. In FIG. 5C, because the drain region 14 is routed around the gate electrode 20, the drain region 14 spaced from the base region 12 is shown.

A drift region 15 is provided between the base region 12 and the drain region 14. The bottom surface of the drift region 15 is located below the bottom surface of the base region 12 toward the semiconductor layer 10. An STI region 16 is provided in the drift region 15. The bottom surface of the STI region 16 is located below the bottom surface of the drain region 14. Part of the side surface of the STI region 16 on the drain region 14 side is in contact with the drain region 14. The side surface and bottom surface of the STI region 16 are surrounded by the drift region 15 and the drain region 14. The drain region 14 is provided in the surface of the drift region 15 and opposed to the source region 13 across the base region 12 and the STI region 16 in the direction generally perpendicular to the generally parallel extending direction. By applying a voltage between the source and the drain to control the potential of the gate electrode 20 through a gate contact region 23, the electrical continuity between the source and the drain can be turned on/off.

Also in the semiconductor device 2, the distances d1 and d2 are configured to be generally equal and set to 1.8 μm or less. The distance d3 is configured to be shorter than the distances d1 and d2.

Also in such configuration, by the operational effects similar to those of the semiconductor device 1, the semiconductor device 2 has a high source-drain breakdown voltage ($BV_{dSS}$). Furthermore, the distance in the extending direction of the source region 13 is further reduced. Thus, also in the semiconductor device 2, the breakdown voltage is increased not by extending the length d3 of the drift region 15 in the device termination region 91 sandwiched between the STI region 16 and the base region 12. Conversely, the length d3 of the portion of the drift region 15 sandwiched between the STI region 16 and the base region 12 in the device termination region 91 is made shorter than the lengths d1 and d2 of the portion of the drift region sandwiched between the STI region 16 and the base region 12 in the device active region 90 to increase the source-drain breakdown voltage ($BV_{dSS}$). That is, also in the semiconductor device 2, the breakdown voltage of the device termination region 91 is increased without increasing the device area.

Furthermore, in the semiconductor device 2, because the drain region 14 is routed around the gate electrode 20, the current flowing between the main electrodes is larger than in the semiconductor device 1.

In the semiconductor device 2, the distance d3 shown in FIG. 5C is narrowed. This may increase the source-drain on-resistance in the C-C' cross section. However, the electrical continuity path during turn-on of the semiconductor device 2 is primarily the path between the source region 13 and the drain region 14 arranged in parallel. Hence, there is no problem with the increase of source-drain on-resistance in the C-C' cross section.

Third Embodiment

Figure 6A:
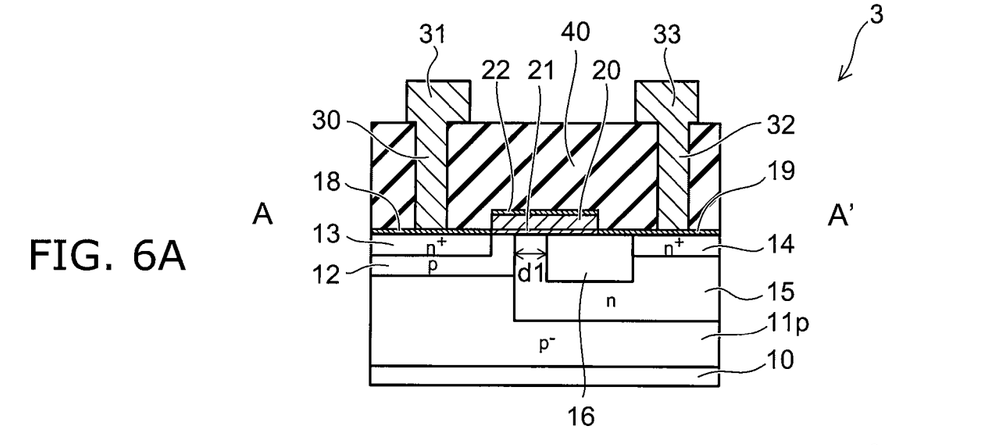
FIGS. 6A to 6C are cross-sectional views of the main part of a semiconductor device according to an embodiment.
Figure 6B:
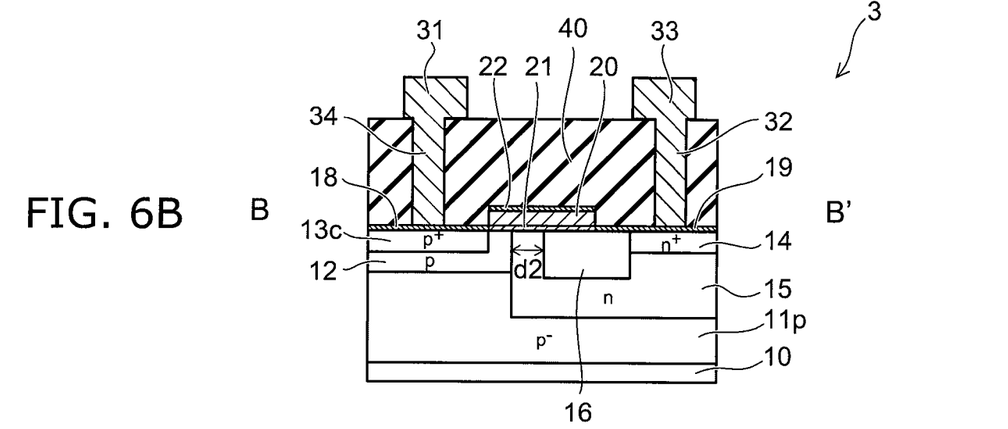
Figure 6C:
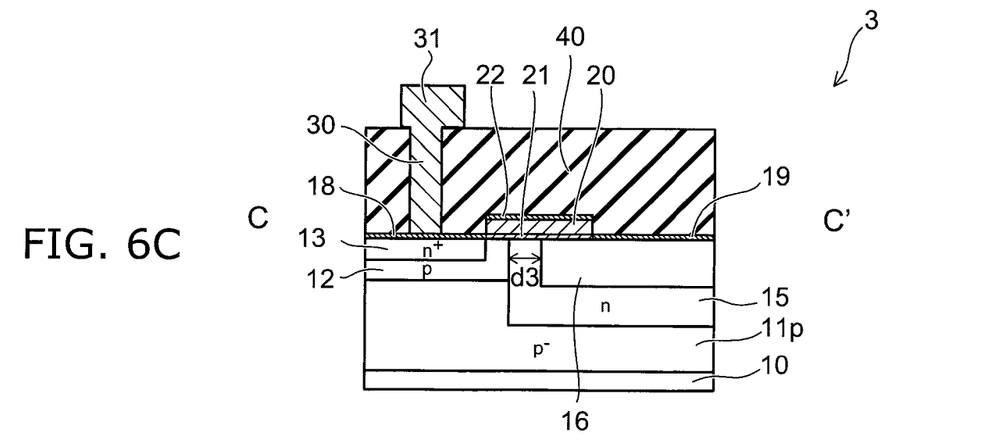

FIGS. 6A to 6C are cross-sectional views of the main part of a semiconductor device according to this embodiment. Here, FIG. 6A corresponds to the A-A' cross section of FIG. 1. FIG. 6B corresponds to the B-B' cross section of FIG. 1. FIG. 6C corresponds to the C-C' cross section of FIG. 1.

In the semiconductor device 3, the N⁻-type semiconductor layer 11n of the semiconductor devices 1 and 2 is replaced by a semiconductor layer 11p of the second conductivity type, or P⁻-type, provided on the semiconductor layer 10. The semiconductor layer 11p may be formed by e.g. epitaxial growth, or may be formed as a well region. The semiconductor layer of the second conductivity type is provided below the base region 12 and the drift region 15. In the semiconductor device 3, this semiconductor layer 11p functions as a RESURF (reduced surface field) layer.

In the semiconductor device 3 having such a RESURF structure, the potential difference between the source region 13 and the gate electrode 20 is set to a voltage lower than the threshold to apply a positive voltage to the drain region 14 relative to the source region 13. Then, from the junction of the drift region 15 below the gate electrode 20 with the base region 12 and the semiconductor layer 11p, a depletion layer extends toward the drift region 15 side, the base region 12 side, and the semiconductor layer 11p side. Furthermore, also from the junction of the drift region 15 below the STI region 16 with the semiconductor layer 11p, a depletion layer extends toward the drift region 15 side and the semiconductor layer 11p side.

Also in the semiconductor device 3, the breakdown voltage is increased not by extending the length d3 of the drift region 15 in the device termination region 91 sandwiched between the STI region 16 and the base region 12. Conversely, the length d3 of the portion of the drift region 15 sandwiched between the STI region 16 and the base region 12 in the device termination region 91 is made shorter than the lengths d1 and d2 of the portion of the drift region sandwiched between the STI region 16 and the base region 12 in the device active region 90 to increase the source-drain breakdown voltage ($BV_{dSS}$). The distances d1 and d2 are configured to be generally equal and set to 1.8 μm or less. The distance d3 is configured to be shorter than the distances d1 and d2. That is, also in the semiconductor device 3, the breakdown voltage of the device termination region 91 is increased without increasing the device area.

In particular, in the semiconductor device 3, because of the RESURF structure, the depletion layer extends more easily than in the semiconductor devices 1 and 2. Hence, the impurity concentration of the drift region 15 can be made higher than in the semiconductor devices 1 and 2. Thus, in the semiconductor device 3, the source-drain on-resistance can be further reduced.

Fourth Embodiment

Figure 7A:
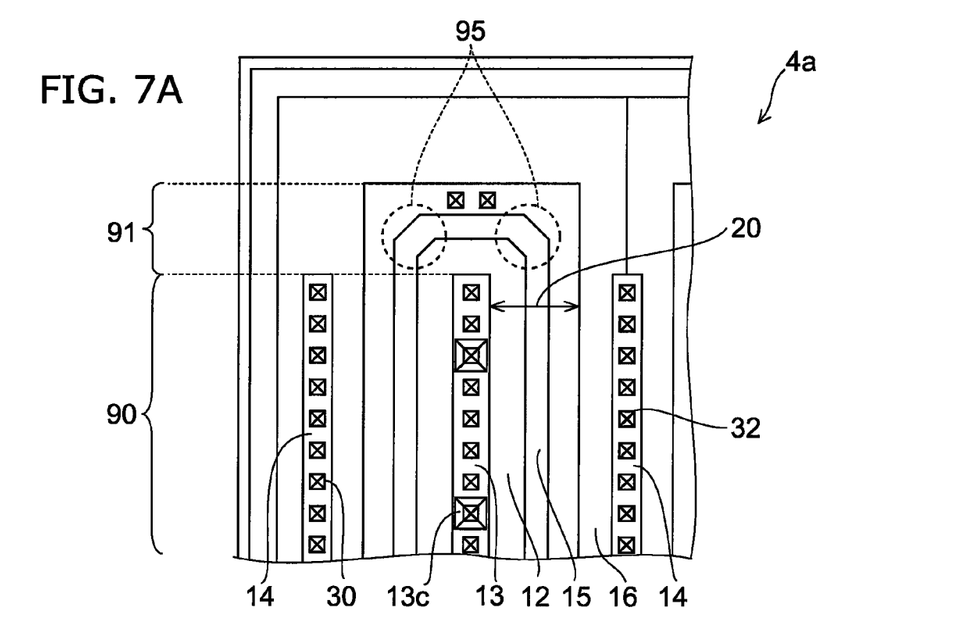
FIGS. 7A and 7B are plan views of the main parts of semiconductor devices according to an embodiment.
Figure 7B:
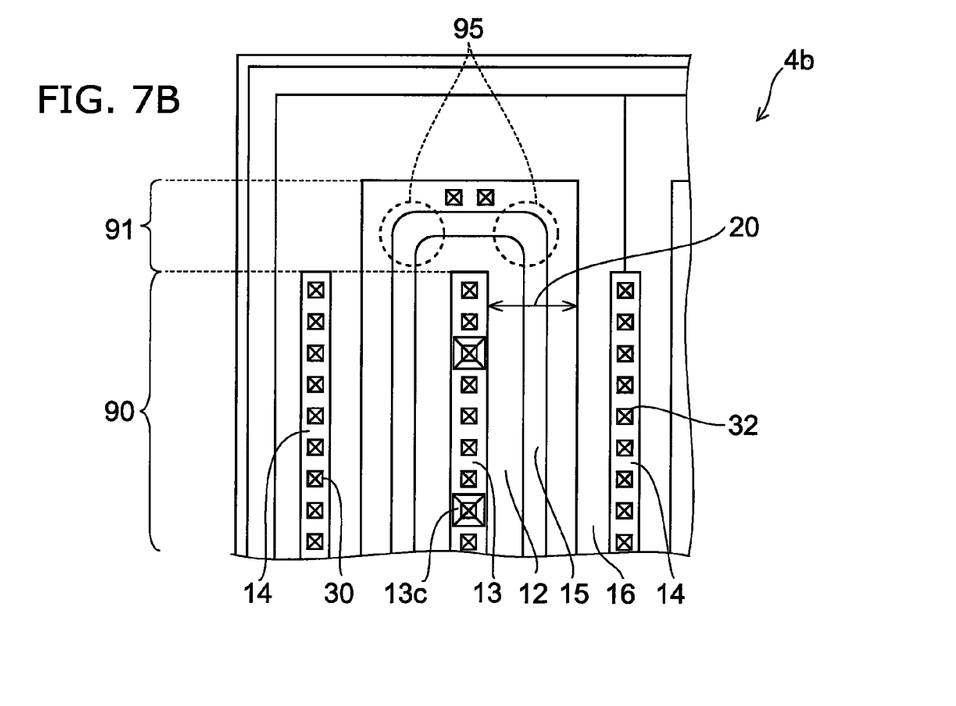

FIGS. 7A and 7B are plan views of the main part of a semiconductor device according to this embodiment.

The semiconductor devices 4a and 4b shown in FIGS. 7A and 7B have the same basic structure as the semiconductor device 2. In the plane (major surface) of the semiconductor devices 4a and 4b, the source region 13 extends in a line shape. In the source region 13, for instance, back gate regions 13c different in conductivity type from the source region 13 are periodically arranged. To the source region 13, the source electrode 31 is connected through a source contact region 30. To the back gate region 13c, the source electrode 31 is connected through a back gate contact region 34.

Furthermore, in the plane of the semiconductor devices 4a and 4b, the drain region 14 extends in a line shape generally parallel to the source region 13. To the drain region 14, the drain electrode 33 is connected through a drain contact region 32. The source regions 13 and the drain regions 14 in a line shape are alternately arranged. Furthermore, the gate electrode 20 is arranged so as to surround the source region 13.

In the semiconductor device 4a, as viewed in the direction perpendicular to the surface of the semiconductor layer 10, the side surface of the corner (end portion) of the base region 12 and the drift region 15 indicated by the dashed line 95 is chamfered (see FIG. 7A). Alternatively, in the semiconductor device 4b, as viewed in the direction perpendicular to the surface of the semiconductor layer 10, the side surface of the corner (end portion) of the base region 12 and the drift region 15 indicated by the dashed line 95 is curved (see FIG. 7B).

Also in the semiconductor devices 4a and 4b, the breakdown voltage is increased not by extending the length d3 of the drift region 15 in the device termination region 91 sandwiched between the STI region 16 and the base region 12. Conversely, the length d3 of the portion of the drift region 15 sandwiched between the STI region 16 and the base region 12 in the device termination region 91 is made shorter than the lengths d1 and d2 of the portion of the drift region sandwiched between the STI region 16 and the base region 12 in the device active region 90 to increase the source-drain breakdown voltage ($BV_{dSS}$). Also in the semiconductor devices 4a and 4b, the distances d1 and d2 are configured to be generally equal and set to 1.8 μm or less. The distance d3 is configured to be shorter than the distances d1 and d2. That is, also in the semiconductor devices 4a and 4b, the breakdown voltage of the device termination region 91 is increased without increasing the device area.

In particular, in the semiconductor device 4a, the side surface of the corner (end portion) of the base region 12 and the drift region 15 is chamfered. In the semiconductor device 4b, the side surface of the corner (end portion) of the base region 12 and the drift region 15 is curved. This suppresses electric field concentration on the corner (end portion) of the base region 12 and the drift region 15, and further increases the source-drain breakdown voltage ($BV_{dSS}$) in the device termination region 91.

Fifth Embodiment

The foregoing configurations of the semiconductor device have been described with reference to the layout in which the source region 13 is surrounded by the gate electrode 20. Alternatively, a similar effect is achieved by the layout in which the drain region 14 is surrounded by the gate electrode 20.

Figure 8:
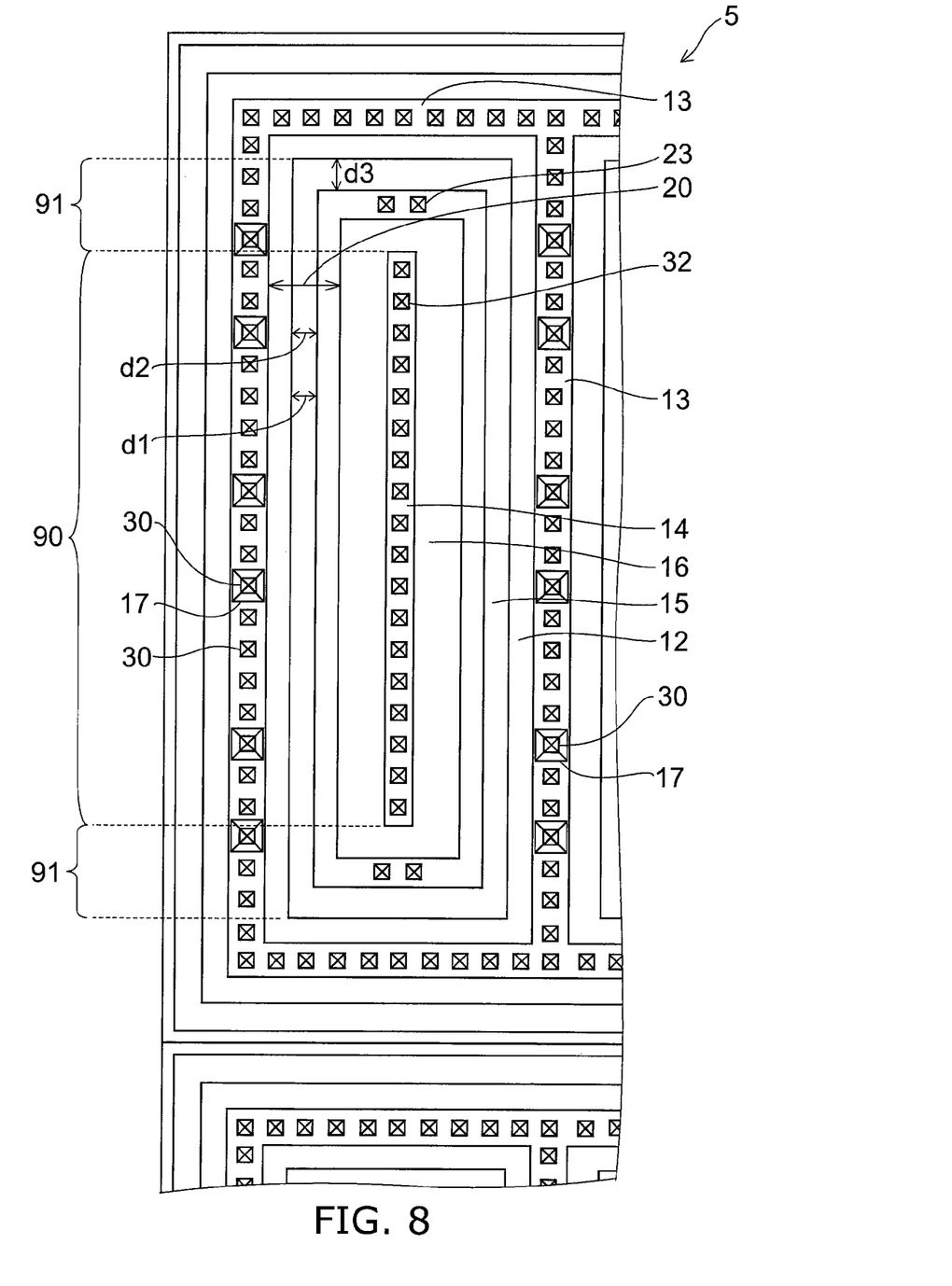
FIG. 8 is a plan view of the main part of a semiconductor device according to an embodiment.

For instance, FIG. 8 is a plan view of the main part of a semiconductor device according to this embodiment.

In the plane of the semiconductor device 5, the drain region 14 extends in a line shape. In the source region 13, for instance, back gate regions 13c different in conductivity type from the source region 13 are periodically arranged. The drain region 14 is surrounded by the source region 13 and the gate electrode 20 as viewed in the direction perpendicular to the surface of the semiconductor layer 10. That is, the source region 13 is arranged so as to surround the drain region 14 as viewed in the direction perpendicular to the surface of the semiconductor layer 10. The base region 12 surrounds the drift region 15, the STI region 16, and the drain region 14. The source regions 13 and the drain regions 14 are alternately arranged.

Here, the length d of the portion of the drift region 15 sandwiched between the base region 12 and the STI region 16 is determined to satisfy the relation such that d3 in the device termination region is made shorter to increase the breakdown voltage of the device termination region 91. That is, also in the semiconductor device 5, the breakdown voltage is increased not by extending the length d3 of the drift region 15 in the device termination region 91 sandwiched between the STI region 16 and the base region 12. Conversely, the length d3 of the portion of the drift region 15 sandwiched between the STI region 16 and the base region 12 in the device termination region 91 is made shorter than the lengths d1 and d2 of the portion of the drift region sandwiched between the STI region 16 and the base region 12 in the device active region 90 to increase the source-drain breakdown voltage ($BV_{dSS}$). Also in the semiconductor device 5, the distances d1 and d2 are configured to be generally equal and set to 1.8 μm or less. The distance d3 is configured to be shorter than the distances d1 and d2. That is, also in the semiconductor device 5, the breakdown voltage of the device termination region 91 is increased without increasing the device area. Also in such configuration, the breakdown voltage of the device termination region 91 can be increased without increasing the device area.

Hereinabove, embodiments of the invention have been described with reference to examples. However, the invention is not limited to these examples. That is, those skilled in the art can suitably modify these examples, and such modifications are also encompassed within the scope of the invention as long as they fall within the spirit of the invention. For instance, various components of the above examples and their layout, material, condition, shape, size and the like are not limited to those illustrated above, but can be suitably modified.

In the above description of the embodiments, the first conductivity type is n-type, and the second conductivity type is p-type. However, the structure in which the first conductivity type is p-type and the second conductivity type is n-type is also encompassed in the embodiments and achieves a similar effect. Furthermore, the invention can be variously modified and practiced without departing from the spirit thereof.

Furthermore, various components of the above embodiments can be combined with each other as long as technically feasible. Such combinations are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a base region of a second conductivity type including a source region of a first conductivity type;
   a drift region of the first conductivity type adjacent to the base region;
   an insulating layer provided from a surface to inside of the drift region;
   a drain region of the first conductivity type provided in the surface of the drift region and opposed to the source region across the base region and the insulating layer;
   a gate oxide film provided on a surface of the base region; and
   a gate electrode provided on the gate oxide film;
   as viewed in a direction perpendicular to the surface of the base region,
   the base region being surrounded by the drift region and the insulating layer,
   the source region and at least a part of the drain region extending generally parallel in a line shape,
   a length of a portion of the drift region sandwiched between the insulating layer and the base region being shorter in the generally parallel extending direction than in a direction generally perpendicular to the generally parallel extending direction.

2. The device according to claim 1, wherein a length of the gate electrode in a direction from the source region toward the insulating layer is 10 μm or less.

3. The device according to claim 1, further comprising a semiconductor layer of the second conductivity type below the base region and the drift region.

4. The device according to claim 1, wherein the length of the portion of the drift region sandwiched between the insulating layer and the base region in the generally parallel extending direction is 1.8 micrometers (μm) or less.

5. A semiconductor device comprising:
   a device active region segment; and
   a device termination region segment,
   the device active region segment having:
      a gate electrode provided on the gate oxide film;
      a source region of a first conductivity type provided parallel to a first direction;
      a drain region of the first conductivity type provided parallel to the first direction, and the drain region opposed to the source region across the gate electrode;
      an insulating layer provided between the source region and the drain region, and a portion of the insulating layer facing a lower surface of the gate electrode;
      a base region provided further toward the source region side than the insulating layer, and a portion of the base region facing a lower surface of the gate electrode; and
      a drift region provided further toward the insulating layer side than the base region, a portion of drift region having a second length in a second direction orthogonal to the first direction, and the portion of drift region facing the lower surface of the gate electrode,
   the device termination region segment having:
      the gate electrode provided on the gate oxide film;
      the source region;
      the insulating layer, and a portion of the insulating layer facing the lower surface of the gate electrode;
      the base region provided further toward the source region side than the insulating layer, and a portion of the base region facing the lower surface of the gate electrode; and
      the drift region provided further toward the insulating layer side than the base region, a portion of drift region having a first length in the first direction, the first length being shorter than the second length, and the portion of drift region facing the lower surface of the gate electrode.

6. The device according to claim 5, wherein the first length is 1.8 micrometers (μm) or less.

7. The device according to claim 5, wherein the source region and the drain region are alternately and repetitively arranged in the second direction.

8. The device according to claim 5, wherein the drain region is provided so as to surround the source region.

9. The device according to claim 5, wherein the source region is provided so as to surround the drain region.

10. The device according to claim 5, wherein a length of the gate electrode in a direction from the source region toward the insulating layer is 10 μm or less.

11. A semiconductor device comprising a semiconductor element,
   the semiconductor element having:
      a source region of a first conductivity type provided parallel to a first direction;
      a drain region of the first conductivity type provided parallel to the first direction;
      a drift region of the first conductivity type provided between the drain region and the source region, and the drift region being in contact with the drain region;
      a base region of a second conductivity type provided between the source region and the drift region, and the base region being in contact with the source region;

an insulating layer provided on the drift region from an upper surface of the drift region toward inside of the drift region; and a gate electrode provided on the base region between the source region and the insulating layer and on the drift region between the source region and the insulating layer via a gate oxide film, the semiconductor element having a device active region segment and a device termination region segment, a first length of the drift region sandwiched between the base region and the insulating layer in the first direction in the device termination region segment being shorter than a second length of the drift region sandwiched between the base region and the insulating layer in a second direction in the device active region segment, and the second direction being orthogonal to the first direction.

12. The device according to claim 11, wherein the base region is provided so as to surround the source region, the drift region is provided so as to surround the base region, the insulating layer is provided so as to surround the base region on a side of the base region so as that a portion of the drift region has the second length parallel to a second direction and the first length parallel to the first direction, the second direction is orthogonal to the first direction, and the first length is shorter than the second length, as viewed from above.

13. The device according to claim 11, wherein the drift region is provided so as to surround the drain region, the base region is provided so as to surround the drift region, the insulating layer is provided so as to surround the drain region on a side of the base region so as that a portion of the drift region has the second length parallel to a second direction and the first length parallel to the first direction, the second direction is orthogonal to the first direction, and the first length is shorter than the second length, as viewed from above.

14. The device according to claim 11, wherein the first length is 1.8 micrometers (μm) or less.

15. The device according to claim 11, wherein the source region and the drain region are alternately and repetitively arranged in the second direction.

16. The device according to claim 11, wherein a length of the gate electrode in a direction from the source region toward the insulating layer is 10 μm or less.

17. The device according to claim 12, wherein the drain region is provided so as to surround the source region.

18. The device according to claim 13, wherein the source region is provided so as to surround the drain region.

19. A semiconductor device comprising a semiconductor element, the semiconductor element having:

a source region of a first conductivity type provided parallel to a first direction;

a drain region of the first conductivity type provided parallel to the first direction;

a drift region of the first conductivity type provided between the drain region and the source region, and the drift region being in contact with the drain region;

a base region of a second conductivity type provided between the source region and the drift region, and the base region being in contact with the source region;

an insulating layer provided on the drift region from an upper surface of the drift region toward inside of the drift region; and a gate electrode provided on the base region between the source region and the insulating layer and on the drift region between the source region and the insulating layer via a gate oxide film, the semiconductor element having a device active region segment and a device termination region segment, and a length of a portion of the drift region sandwiched between the insulating layer and the base region in the first direction being 1.8 micrometers (μm) or less in the device termination region segment.

20. The device according to claim 19, wherein a length of the gate electrode in a direction from the source region toward the insulating layer is 10 μm or less.

\* \* \* \* \*